(12) United States Patent
Logan et al.

(10) Patent No.: US 11,942,919 B2
(45) Date of Patent: Mar. 26, 2024

(54) STRAIN COMPENSATED RARE EARTH GROUP III-NITRIDE HETEROSTRUCTURES

(71) Applicant: Raytheon Company, Waltham, MA (US)

(72) Inventors: John A. Logan, Lawrence, MA (US); Jason C. Soric, North Andover, MA (US); Adam E. Peczalski, Everett, MA (US); Brian D. Schultz, Lexington, MA (US); Eduardo M. Chumbes, Andover, MA (US)

(73) Assignee: Raytheon Company, Tewksbury, MA (US)

( * ) Notice: Subject to any disclaimer, the term of this patent is extended or adjusted under 35 U.S.C. 154(b) by 491 days.

(21) Appl. No.: 17/145,665

(22) Filed: Jan. 11, 2021

(65) Prior Publication Data

US 2022/0224306 A1    Jul. 14, 2022

(51) Int. Cl.
*H03H 9/02* (2006.01)
*H03H 3/04* (2006.01)
*H03H 9/17* (2006.01)
*H03H 3/02* (2006.01)

(52) U.S. Cl.
CPC .......... *H03H 9/02133* (2013.01); *H03H 3/04* (2013.01); *H03H 9/02031* (2013.01); *H03H 9/02102* (2013.01); *H03H 9/174* (2013.01); *H03H 9/176* (2013.01); *H03H 2003/023* (2013.01); *H03H 2003/0407* (2013.01)

(58) Field of Classification Search
CPC .......... H03H 9/02133; H03H 9/02031; H03H 9/02102; H03H 9/17; H03H 9/176
See application file for complete search history.

(56) References Cited

U.S. PATENT DOCUMENTS

| 9,035,354 | B2 | 5/2015 | Saxler et al. |
| 9,160,298 | B2 | 10/2015 | Yokoyama |
| 9,246,079 | B2 | 1/2016 | Umeda et al. |
| 9,374,060 | B2 | 6/2016 | Onda |

(Continued)

FOREIGN PATENT DOCUMENTS

| CN | 109905098 A | 6/2019 |
| TW | 200705696 A | 2/2007 |

(Continued)

OTHER PUBLICATIONS

Office Action and Search Report dated Sep. 14, 2022 in corresponding Taiwan Patent Application No. 111101146.

(Continued)

*Primary Examiner* — Bryan P Gordon
(74) *Attorney, Agent, or Firm* — Bachman & LaPointe, P.C.

(57) ABSTRACT

A strain compensated heterostructure comprising a substrate comprising silicon carbide material; a first epitaxial layer comprising single-crystal aluminum nitride material formed on a top surface of the substrate; a second epitaxial layer formed on the first epitaxial layer opposite the top surface of the substrate, the second epitaxial layer comprising single-crystal scandium aluminum nitride material; and a third epitaxial layer formed on the second epitaxial layer opposite the first epitaxial layer, the third layer comprising single-crystal aluminum nitride material.

20 Claims, 5 Drawing Sheets

(56) References Cited

U.S. PATENT DOCUMENTS

| | | |
|---|---|---|
| 10,079,334 B2 | 9/2018 | Moulard et al. |
| 10,193,526 B2 | 1/2019 | Lee et al. |
| 10,367,087 B2 | 7/2019 | Coffie |
| 10,554,194 B2 | 2/2020 | Lee et al. |
| 10,727,809 B2 | 7/2020 | Sadhu et al. |
| 2004/0263026 A1* | 12/2004 | Wang ................. H03H 9/564 310/341 |
| 2006/0278891 A1* | 12/2006 | Saxler ................. C30B 29/36 438/285 |
| 2007/0004184 A1 | 1/2007 | Saxler |
| 2010/0187570 A1* | 7/2010 | Saxler ................ H01L 29/7785 257/192 |
| 2017/0141750 A1* | 5/2017 | Pelzel ................. H01L 29/778 |
| 2018/0130883 A1 | 5/2018 | Hardy et al. |
| 2019/0006502 A1* | 1/2019 | Coffie ................ H01L 29/2003 |
| 2020/0161417 A1 | 5/2020 | Dargis et al. |
| 2021/0091746 A1 | 3/2021 | Gokhale et al. |

FOREIGN PATENT DOCUMENTS

| | | |
|---|---|---|
| TW | 200727478 A | 7/2007 |
| TW | 201737462 A | 10/2017 |
| WO | 2020083552 A1 | 4/2020 |

OTHER PUBLICATIONS

International Search Report dated Mar. 24, 2022 for Patent Application No. PCT/US/2022/011947.

\* cited by examiner

STRAIN COMPENSATED RARE EARTH GROUP III-NITRIDE HETEROSTRUCTURES

BACKGROUND

The present disclosure is directed to strain compensated heterostructures and acoustic wave resonators incorporating same.

Surface acoustic wave resonators made of piezoelectric materials are widely used in communication and timing applications. Aluminum nitride (AlN) as the device material has been used due to its potential of high frequency applications due to its high surface phase velocity compared to materials such as lithium niobate (LiNbO$_3$). Scandium alloyed aluminum nitride (ScAlN) can exhibit high piezoelectric coefficients and is considered suitable for high electromechanical coupling surface acoustic wave and bulk acoustic wave (BAW) resonators.

However, development of epitaxial ScAlN BAW resonators has been impeded by difficulties with membrane cracking. The cracking is theorized to occur due to a mix of stress/strain sources, such as Coefficient of Thermal Expansion (CTE) differences; lattice parameter mismatch (Δa); and partial substrate removal.

Figure 1:
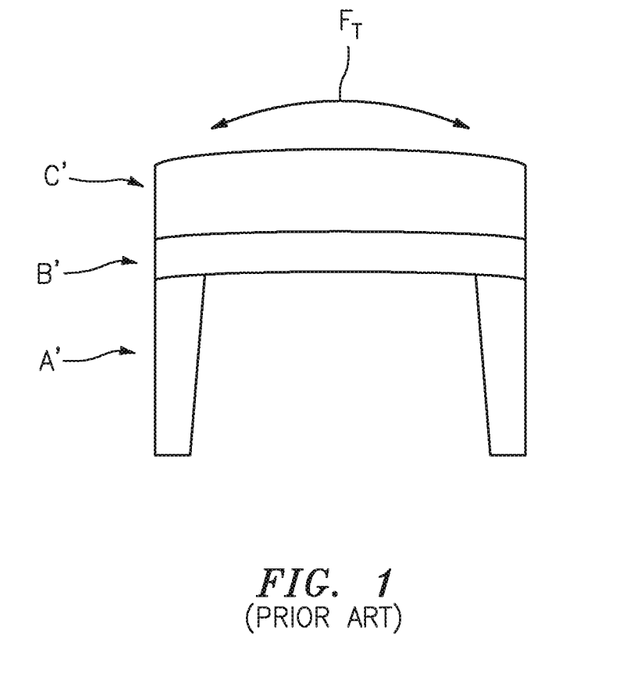
FIG. 1 is a schematic of a prior art resonator stack.
Figure 2:
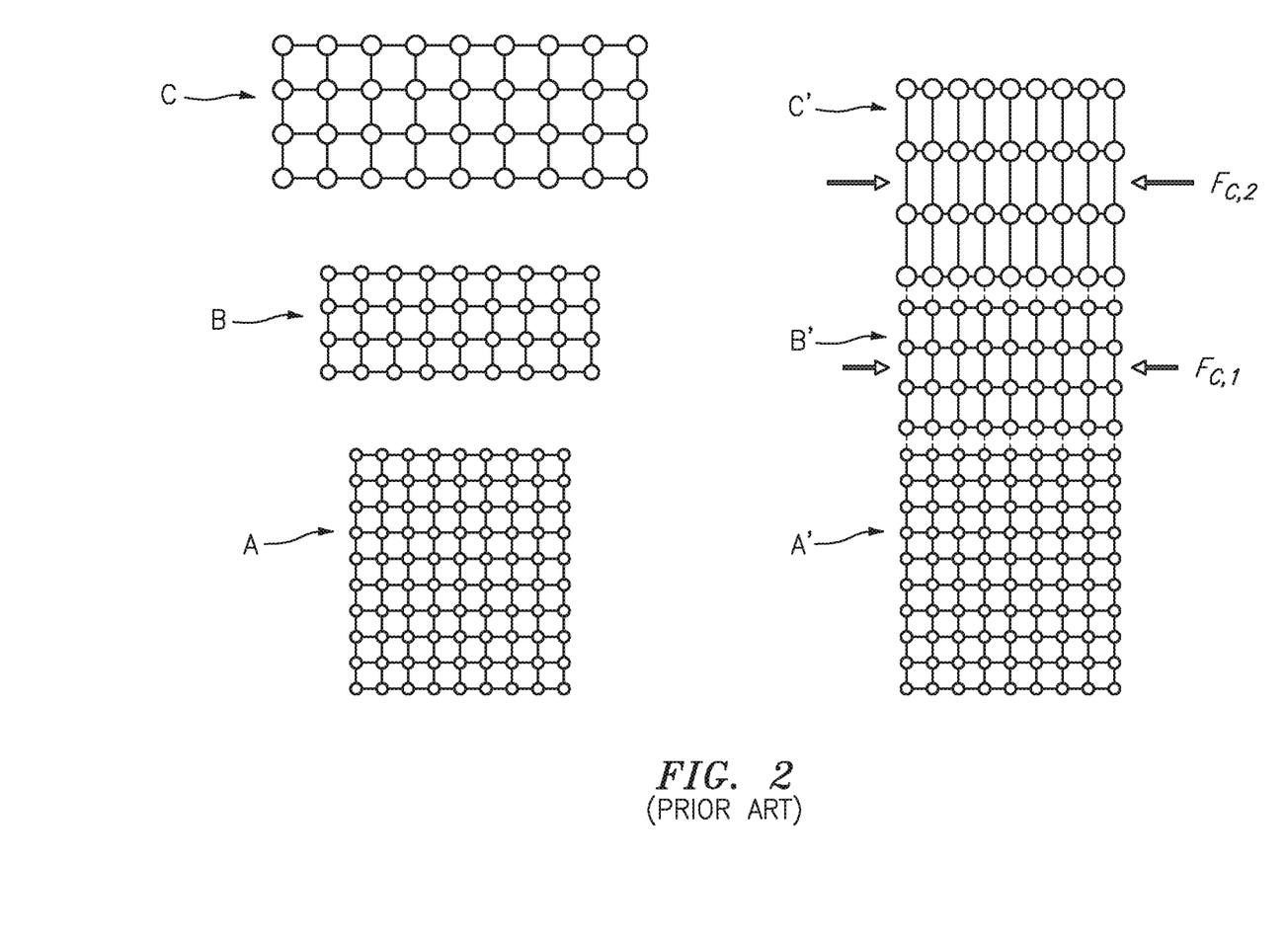
FIG. 2 is a schematic of related crystal lattice structures.

Referring to FIG. 1, a schematic of a resonator stack and FIG. 2 a schematic of related crystal lattice structures are shown. The silicon carbide (SiC) substrate layer A' is coated with the aluminum nitride (AlN) layer B' which is coated by a scandium aluminum nitride (ScAlN) layer C'. The schematic illustrates the presence of additional surface tensile forces FT that are apparent from the difference in crystal lattice parameter in the layers A', B', C' respective to the partial removal of substrate A' where $a_{SiC} < a_{AlN} < a_{ScAlN}$. As seen in FIG. 2, when grown in a single crystal epitaxial structure, the differences in crystal lattice parameters results in the additional compressive forces $F_{C,1}$ and $F_{C,2}$ on the upper thin film layers B' and C'. The substrate A has a smaller lattice constant. As the upper thin film layers B' and C' are formed on the substrate A', additional compressive forces $F_{C,1}$ and $F_{C,2}$ act on the upper thin film layers B', C' as they are confined by the substrate A' below. The upper layers B', C' compress during formation due to epitaxial arrangement from growth. When the substrate A' material is removed during processing, the confining forces $F_{C,1}$ and $F_{C,2}$ are partially or fully released. The upper thin film layers B', C' expand, as they are no longer confined by the substrate confining forces $F_{C,1}$ and $F_{C,2}$. The expansion leads to deformation and/or cracking of the layers B', C' of the resonator membrane. When the membrane of the layers B' and C' are bowed, the upper layer C' surface becomes strained in tension and the lower layer B' surface strained in compression. If the strain gradient between the two layers B', C' are sufficient, the membrane cracks.

What is needed is a process for eliminating the problems created by the strain/stress between the membrane layers.

SUMMARY

In accordance with the present disclosure, there is provided a strain compensated heterostructure comprising a substrate comprising silicon carbide material; a first epitaxial layer comprising single-crystal aluminum nitride material formed on a top surface of the substrate; a second epitaxial layer formed on the first epitaxial layer opposite said top surface of the substrate, the second epitaxial layer comprising single-crystal scandium aluminum nitride material; and a third epitaxial layer formed on the second epitaxial layer opposite the first epitaxial layer, the third layer comprising single-crystal aluminum nitride material.

A further embodiment of any of the foregoing embodiments may additionally and/or alternatively include the strain compensated heterostructure further comprises the strain compensated heterostructure being free standing responsive to release from the substrate.

A further embodiment of any of the foregoing embodiments may additionally and/or alternatively include the strain compensated heterostructure further comprises the strain compensated heterostructure being free standing responsive to the substrate being etched from the first layer.

A further embodiment of any of the foregoing embodiments may additionally and/or alternatively include the first epitaxial layer and the second epitaxial layer include a first interfacial strain; and the third epitaxial layer and the second epitaxial layer include a second interfacial strain equal to the first interfacial strain.

A further embodiment of any of the foregoing embodiments may additionally and/or alternatively include the first interfacial strain is responsive to a difference in lattice parameter values and/or coefficient of thermal expansion values between the first epitaxial layer and the second epitaxial layer.

A further embodiment of any of the foregoing embodiments may additionally and/or alternatively include the second interfacial strain is responsive to a difference in lattice parameter values and/or coefficient of thermal expansion values between the third epitaxial layer and the second epitaxial layer.

A further embodiment of any of the foregoing embodiments may additionally and/or alternatively include the first epitaxial layer, the second epitaxial layer formed on the first epitaxial layer and the third epitaxial layer formed on the second epitaxial layer opposite the first epitaxial layer comprise a neutrally stressed membrane responsive to release from the substrate.

In accordance with the present disclosure, there is provided a multilayer membrane structure for a bulk acoustic wave resonator comprising a releasable substrate having a top surface; a first epitaxial layer comprising single-crystal aluminum nitride material formed on the top surface of the substrate; a second epitaxial layer formed on the first epitaxial layer opposite the top surface of the substrate, the second epitaxial layer comprising single-crystal scandium aluminum nitride material; and a third epitaxial layer formed on the second epitaxial layer opposite the first epitaxial layer, the third layer comprising single-crystal aluminum nitride material.

A further embodiment of any of the foregoing embodiments may additionally and/or alternatively include the membrane structure further comprising the multilayer membrane structure being free standing responsive to the releasable substrate being etched from the first epitaxial layer.

A further embodiment of any of the foregoing embodiments may additionally and/or alternatively include the multilayer membrane structure comprise a neutrally stressed membrane responsive to release of the substrate.

A further embodiment of any of the foregoing embodiments may additionally and/or alternatively include the first epitaxial layer and the second epitaxial layer comprise a first interfacial strain; and the third epitaxial layer and the second epitaxial layer comprise a second interfacial strain opposite the first interfacial strain with respect to said second epitaxial layer.

A further embodiment of any of the foregoing embodiments may additionally and/or alternatively include the first interfacial strain equals the second interfacial strain on opposite sides of the second epitaxial layer.

A further embodiment of any of the foregoing embodiments may additionally and/or alternatively include the multilayer membrane structure comprise a suspended membrane having an equal but opposite strain gradient responsive to release of the substrate.

In accordance with the present disclosure, there is provided a process for making a neutrally stressed released multilayer membrane structure for a bulk acoustic wave resonator comprising providing a releasable substrate having a top surface; forming a first epitaxial layer comprising single-crystal aluminum nitride material on the top surface of the substrate; forming a second epitaxial layer on the first epitaxial layer opposite the top surface of the substrate, the second epitaxial layer comprising single-crystal scandium aluminum nitride material; forming a third epitaxial layer formed on the second epitaxial layer opposite the first epitaxial layer, the third layer comprising single-crystal aluminum nitride material; and removing the substrate from the first epitaxial layer.

A further embodiment of any of the foregoing embodiments may additionally and/or alternatively include the substrate comprises silicon carbide material.

A further embodiment of any of the foregoing embodiments may additionally and/or alternatively include the process further comprising balancing a first interfacial strain with a second interfacial strain.

A further embodiment of any of the foregoing embodiments may additionally and/or alternatively include the first interfacial strain is formed between the first epitaxial layer and the second epitaxial layer; and the second interfacial strain is formed between the third epitaxial layer and the second epitaxial layer.

A further embodiment of any of the foregoing embodiments may additionally and/or alternatively include removing the substrate from the first epitaxial layer comprises etching the substrate.

A further embodiment of any of the foregoing embodiments may additionally and/or alternatively include the process further comprising mirroring an interface between the first epitaxial layer and the second epitaxial layer and an interface between the third epitaxial layer and the second epitaxial layer.

A further embodiment of any of the foregoing embodiments may additionally and/or alternatively include a crystal lattice parameter of the substrate is less than a crystal lattice parameter of the first epitaxial layer and the crystal lattice parameter of the first epitaxial layer is less than a crystal lattice parameter of the second epitaxial layer; and a crystal lattice parameter of the third epitaxial layer is equal to the crystal lattice parameter of the first epitaxial layer.

Other details of the strain compensated heterostructures and process are set forth in the following detailed description and the accompanying drawings wherein like reference numerals depict like elements.

DETAILED DESCRIPTION

Figure 3:
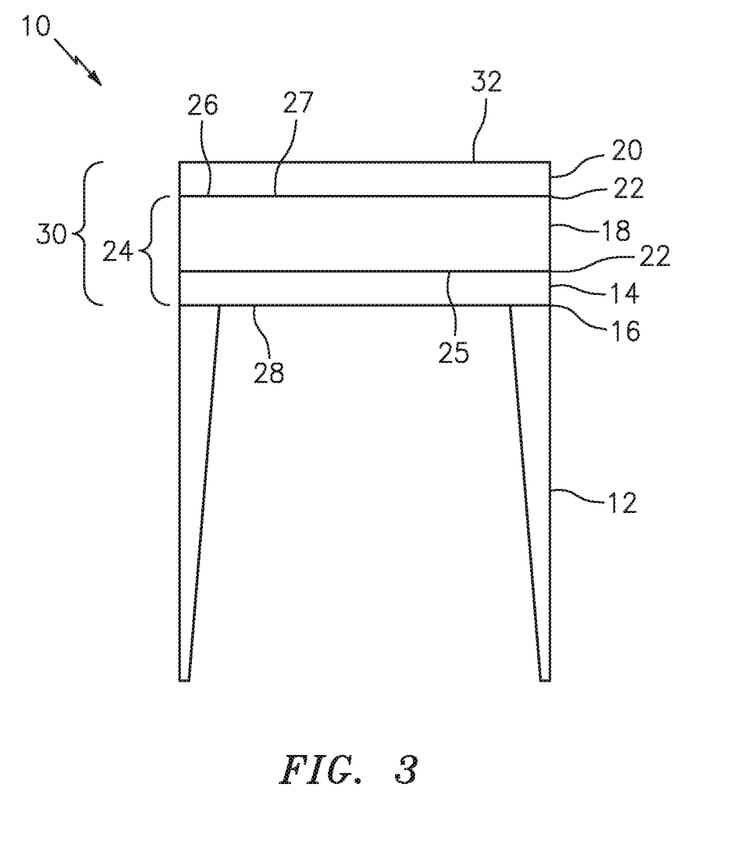
FIG. 3 is a schematic of an exemplary crystal lattice structure.

Referring now to FIG. 3, there is illustrated a stack 10 including a substrate 12 having a first layer 14 formed on a substrate surface 16. The substrate 12 can possess material characteristics, such as a particular lattice constant $a_{SiC}$. The substrate 12 can include a silicon carbide (SiC) material, silicon, sapphire, GaN, or other suitable epitaxial template substrate upon which the first layer 14 can be nucleated. The substrate 12 can be single crystal material. The first layer 14 can possess material characteristics different from the substrate 12, such as a lattice constant $a_{AlN}$, or a coefficient of thermal expansion CTE $\alpha_{AlN}$. The first layer 14 can be an aluminum nitride (AlN) material. The first layer 14 can be an epitaxial single-crystal film. The first layer 14 can be a nucleation layer. A second layer 18 can be formed on the first layer 14 opposite the substrate 12. The second layer 18 can possess material characteristics that are different from the substrate 12 and the first layer 14, such as a lattice constant of $a_{ScAlN}$ and/or CTE $\alpha_{ScAlN}$. The second layer 18 can be an epitaxial single-crystal film. The second layer 18 can be a scandium aluminum nitride (ScAlN) material. A third layer 20 can be formed on the second layer 18 opposite the first layer 14. The third layer 20 can possess the same material characteristics of the first layer 14, such as a lattice constant $a_{AlN}$ and/or CTE $\alpha_{AlN}$. The third layer 20 can be an epitaxial single-crystal film. The third layer 20 can be an aluminum nitride (AlN) material. In an exemplary embodiment, the third layer 20 can be a scandium aluminum nitride (ScAlN) composition that includes a composition with a lower scandium concentration than the second layer. For example, the second layer 18 can include a composition of $Sc_{0.30}Al_{0.70}N$ and the third layer 20 can be a composition of $Sc_{0.05}Al_{0.95}N$. The third layer 20 can include a layer that is a thicker $Sc_{0.05}Al_{0.95}N$ layer than if AlN was used as it has a closer lattice match to $Sc_{0.30}Al_{0.70}N$ than AlN. The goal is to balance the stress on either side of the second layer 18 that comprises $Sc_{0.30}Al_{0.7}0N$. The compositions and thicknesses in the layers 14, 18 and 20 can be configured to also correct for the CTE differences based on thermal growth from process temperatures.

After the first layer 14 and the second layer 18 are formed on the substrate 12, a resultant compressive force will act on the stack 10. As explained above, the mismatch of the material characteristics of the substrate 12, the first layer 14 and the second layer 18 will impart compressive forces on the stack 10. Particularly, when growing epitaxial single-crystal films, large interfacial strains can occur due to the difference in lattice parameter and coefficient of thermal expansion between the heteroepitaxial materials. If the difference is small enough and if the films are below the relaxation critical thickness, a coherent (or semi-coherent) interface 22 can form where the crystal structure is distorted at the interface 22 to allow for bond matching. The first layer 14 comprising AlN has a smaller lattice parameter than the second layer 18 comprising ScAlN. When the substrate 12 is released from the first layer 14, the AlN/ScAlN bilayer 24 bows or distorts in an attempt to relieve the interfacial strain 25. When the bilayer 24 is bowed, the second layer 18 upper surface 26 becomes strained in tension and the lower surface 28 of the first layer 14 AlN becomes strained in compression.

The third layer 20, after being formed on the second layer 18, having the same material properties as the first layer 14, will impart counter bowing forces on the second layer 18 opposite to the forces imparted by the first layer 14 on the second layer 18. If the third layer 20 includes a similar material but has a different thickness or a different concentration of materials in the composition, the third layer 20 can impart counter forces on the second layer 18 opposite to the forces imparted by the first layer 14 on the second layer 18. When the substrate 12 is released from the membrane 30, the bowing forces imparted by the first layer 12 will equal the bowing forces imparted by the third layer 20, resulting in a strain/stress balance on the membrane 30. The unique layering disclosed leverages the epitaxial nature of the growth of the materials in the layers 14, 18, 20, and by mirroring the strain on either side of the second layer 18 of ScAlN, the impact of the difference between lattice parameter ($a_{AlN}$ and $a_{ScAlN}$) as well as CTE ($\alpha_{AlN}$ and $\alpha_{ScAlN}$) can be eliminated. An equal but opposite strain gradient on the surface 32 is imparted by the third layer 20 in order to match the lower ScAlN/AlN interface 22. Therefore, when the substrate 12 is removed, the suspended membrane 30 remains neutrally stressed and does not crack, enabling further processing and device fabrication. With the improvement of the additional third layer 20 on the stack 10 to counterbalance the first layer 14, upon release, the resonator membrane 30 will not crack or deform. It is contemplated that a range of net stress values can be obtained, where the residual stress will not cause sufficient deformation to crack the membrane 30.

Figure 4:
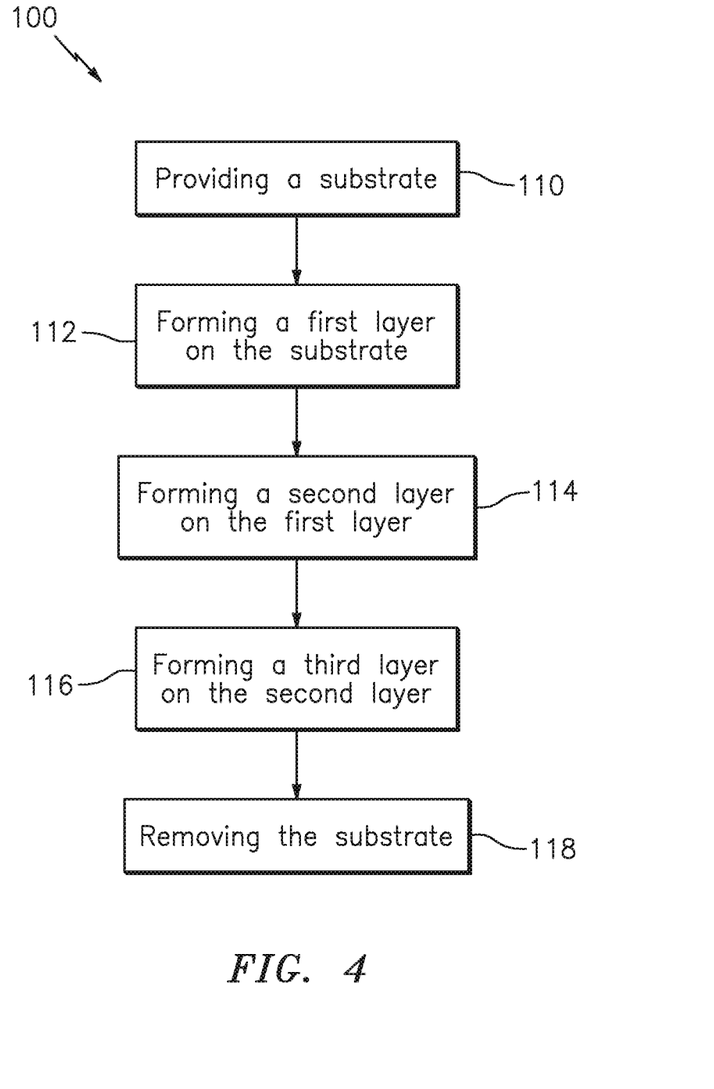
FIG. 4 is a process diagram for the exemplary process.

Referring also to FIG. 4 a process map is shown. The process 100 generally describes the steps used to prevent the resonator membrane 30 from deforming during production. The process 100 includes the step 110 of providing a substrate. The next step 112 includes forming a first layer on the substrate. The first layer can be epitaxially grown. In an exemplary embodiment, the first layer can be AlN material. The next step 114 includes forming a second layer on the first layer. The second layer can be epitaxial. The second layer can be a ScAlN material. The next step 116 includes forming a third layer on the second layer. The third layer can be epitaxial. The third layer can be the same material as the first layer. The third layer can be AlN. The resultant stack results in the first layer and the third layer having equal but opposite strain gradient with respect to the second layer in the stack. The next step includes removing the substrate from the first layer. The substrate can be etched to allow for electrical contact with electrodes. With the substrate removed, the membrane in the stack is suspended, however the stack will not deform due to strain gradient built up from the epitaxial growth of the first and second layers in the substrate. The third layer provides a balancing force to match the first and second layer forces formed during layer formation.

Figure 5:
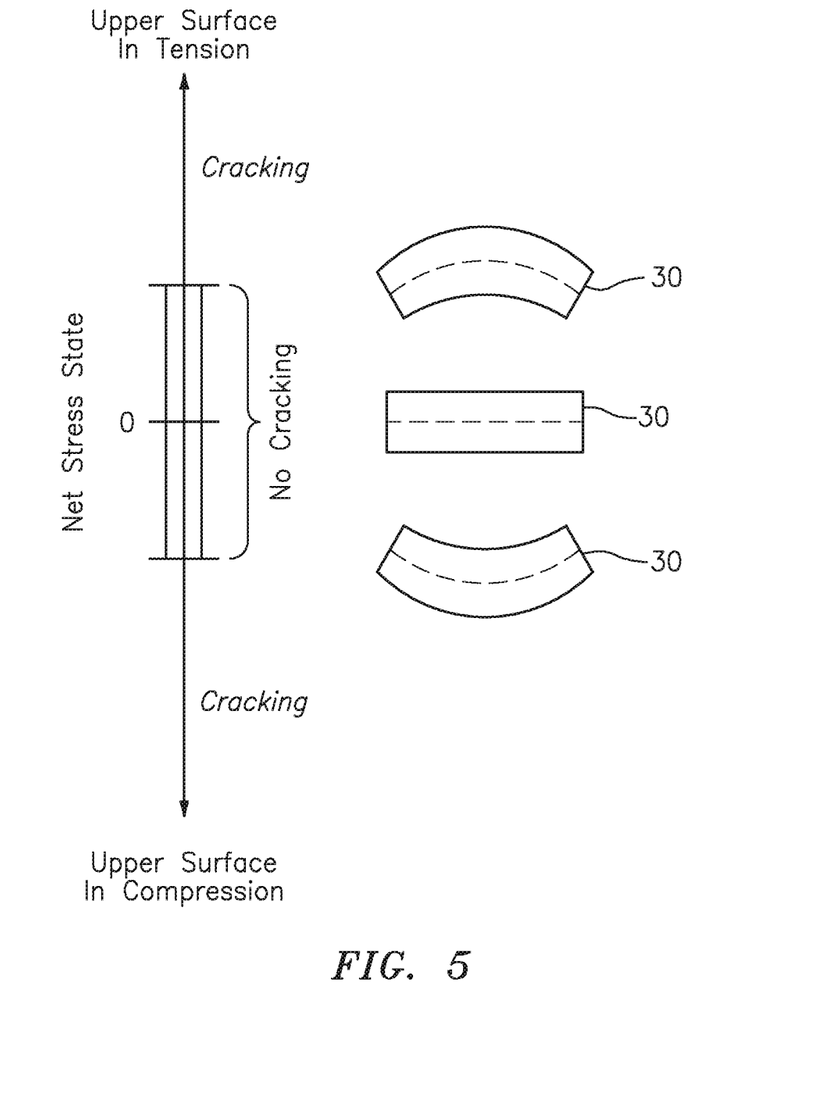
FIG. 5 is a schematic diagram illustrating the exemplary net stress state.

Referring also to FIG. 5, a schematic diagram illustrates the net stress state relationship between the layers 14, 18, 20. The net stress state can be understood as a set of force balances between the layers 14, 18, 20. The forces on the layers 14, 18, 20 can be balanced such that there is no cracking in the membrane 30. The diagram at FIG. 5 illustrates that there is a region of force balancing on either side of a value of zero. The diagram shows a region near zero which is less than the critical strain level for cracking (in either the compressive or tensile direction). Membranes with force balances within this region near zero are termed neutrally stressed. The closer to zero the forces can be balanced, the more processing tolerance and resonator durability will result. The forces do not have to balance at exactly zero net force, instead there are some forces that can exist on either side of the zero balanced value. There will be a value beyond the balance that results in cracking. The absolute numbers in the balance will depend on the combination of material compositions and thicknesses in the layers 14, 18, 20. The disclosed process includes the concept of manipulating the stain/stress formed during production to avoid the deformation of the membrane after removal of the substrate. It is contemplated that a variety of materials can be utilized as substrates. However utilizing different substrate materials, may change the initial stress conditions between the layers 14, 16, 18 and the substrate 12. For instance for SiC substrate, there will be an initial compressive force on the epi-layers (as SiC has a smaller lattice parameter). The opposite would happen for Silicon (as it has a larger lattice parameter). However, in either case, the membrane stress balance problem and solution described herein remains unchanged. The membrane stack can be utilized with a resonator, such as a bulk acoustic wave (BAW) resonator.

A technical advantage of the exemplary disclosure includes a neutrally stressed released membrane for use as a resonator.

Another technical advantage of the exemplary epitaxial single crystal AlN/ScAlN/AlN membrane includes inhibition of the released membrane from bowing and subsequently prevents cracking.

Another technical advantage of the exemplary epitaxial single crystal AlN/ScAlN/AlN membrane includes introduction of a strain matching surface layer (third layer) to compensate for the strain present at the interface between the nucleation layer (first layer) and the second layer.

Another technical advantage of the exemplary process includes applying the disclosed process to other combinations of materials with respect to Rare-Earth III-Nitride (IIIA, IIIB, Lanthanides, for example: AlGaN, InGaN, ScAlN, YAlN, and the like) multilayer membrane structures.

Another technical advantage of the exemplary process includes a suspended membrane free of deformation allowing a free standing device.

Another technical advantage of the exemplary process includes mirroring an interface between the first epitaxial layer and the second epitaxial layer and an interface between the third epitaxial layer and the second epitaxial layer.

Another technical advantage of the exemplary process results in the first interfacial strain equaling the second interfacial strain in magnitude on opposite sides of the second epitaxial layer.

Another technical advantage of the exemplary process results in the multilayer membrane structure comprising a neutrally stressed membrane responsive to release of the substrate.

There has been provided a strain compensated heterostructures and process. While the strain compensated heterostructures and process has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:
1. A strain compensated heterostructure comprising:
a substrate comprising silicon carbide material;
a first epitaxial layer comprising single-crystal aluminum nitride material formed on a top surface of said substrate;
a second epitaxial layer formed on said first epitaxial layer opposite said top surface of said substrate, said second epitaxial layer comprising single-crystal scandium aluminum nitride material; and a third epitaxial layer formed on said second epitaxial layer opposite said first epitaxial layer, said third layer comprising single-crystal aluminum nitride material.

2. The strain compensated heterostructure according to claim 1, further comprising the strain compensated heterostructure being free standing responsive to release from said substrate.

3. The strain compensated heterostructure according to claim 1, further comprising the strain compensated heterostructure being free standing responsive to said substrate being etched from said first layer.

4. The strain compensated heterostructure according to claim 1, wherein said first epitaxial layer and said second epitaxial layer include a first interfacial strain; and said third epitaxial layer and said second epitaxial layer include a second interfacial strain equal to said first interfacial strain.

5. The strain compensated heterostructure according to claim 4, wherein said first interfacial strain is responsive to a difference in lattice parameter values and coefficient of thermal expansion values between said first epitaxial layer and said second epitaxial layer.

6. The strain compensated heterostructure according to claim 4, wherein said second interfacial strain is responsive to a difference in lattice parameter values and coefficient of thermal expansion values between said third epitaxial layer and said second epitaxial layer.

7. The strain compensated heterostructure according to claim 1, wherein said first epitaxial layer, said second epitaxial layer formed on said first epitaxial layer and said third epitaxial layer formed on said second epitaxial layer opposite said first epitaxial layer comprise a neutrally stressed membrane responsive to release of said substrate.

8. A multilayer membrane structure for a bulk acoustic wave resonator comprising:
a releasable substrate having a top surface;
a first epitaxial layer comprising single-crystal aluminum nitride material formed on said top surface of said substrate;
a second epitaxial layer formed on said first epitaxial layer opposite said top surface of said substrate, said second epitaxial layer comprising single-crystal scandium aluminum nitride material; and
a third epitaxial layer formed on said second epitaxial layer opposite said first epitaxial layer, said third layer comprising single-crystal aluminum nitride material.

9. The membrane structure according to claim 8, further comprising the multilayer membrane structure being free standing responsive to said releasable substrate being etched from said first epitaxial layer.

10. The membrane structure according to claim 9, wherein the multilayer membrane structure comprise a neutrally stressed membrane responsive to release from said substrate.

11. The membrane structure according to claim 9, wherein said first epitaxial layer and said second epitaxial layer comprise a first interfacial strain; and said third epitaxial layer and said second epitaxial layer comprise a second interfacial strain equal to said first interfacial strain with respect to said second epitaxial layer.

12. The membrane structure according to claim 11, wherein said first interfacial strain equals said second interfacial strain on opposite sides of said second epitaxial layer.

13. The membrane structure according to claim 8, wherein the multilayer membrane structure comprise a suspended membrane having an equal but opposite strain gradient responsive to release of said substrate.

14. A process for making a neutrally stressed released multilayer membrane structure for a bulk acoustic wave resonator comprising:
providing a releasable substrate having a top surface;
forming a first epitaxial layer comprising single-crystal aluminum nitride material on said top surface of said substrate;
forming a second epitaxial layer on said first epitaxial layer opposite said top surface of said substrate, said second epitaxial layer comprising single-crystal scandium aluminum nitride material;
forming a third epitaxial layer formed on said second epitaxial layer opposite said first epitaxial layer, said third layer comprising one of a single-crystal aluminum nitride material or a single-crystal scandium aluminum nitride material; and
removing said substrate from said first epitaxial layer.

15. The process of claim 14, further comprising:
balancing a first interfacial strain with a second interfacial strain.

16. The process of claim 15, wherein said first interfacial strain is formed between said first epitaxial layer and said second epitaxial layer; and said second interfacial strain is formed between said third epitaxial layer and said second epitaxial layer with respect to said second epitaxial layer.

17. The process of claim 14, wherein removing said substrate from said first epitaxial layer comprises etching said substrate.

18. The process of claim 14, further comprising:
mirroring an interface between said first epitaxial layer and said second epitaxial layer and an interface between said third epitaxial layer and said second epitaxial layer.

19. The process of claim 14, wherein said substrate is selected from the group consisting of silicon carbide, silicon, sapphire, gallium nitride and the like.

20. The process of claim 19, wherein a crystal lattice parameter of said substrate is less than a crystal lattice parameter of said first epitaxial layer and said crystal lattice parameter of said first epitaxial layer is less than a crystal lattice parameter of said second epitaxial layer; and a crystal lattice parameter of said third epitaxial layer is equal to said crystal lattice parameter of said first epitaxial layer.

\* \* \* \* \*